(12) United States Patent
Wei (10) Patent No.: US 9,196,769 B2
(45) Date of Patent: Nov. 24, 2015

(54) SUPERLATTICE STRUCTURES AND INFRARED DETECTOR DEVICES INCORPORATING THE SAME

(71) Applicant: L-3 Communications Cincinnati Electronics Corporation, Mason, OH (US)

(72) Inventor: Yajun Wei, Cincinnati, OH (US)

(73) Assignee: L-3 Communications Cincinnati Electronics Corporation, Mason, OH (US)

(*) Notice: Subject to any disclaimer, the term of this patent is extended or adjusted under 35 U.S.C. 154(b) by 0 days.

(21) Appl. No.: 14/313,858

(22) Filed: Jun. 24, 2014

(65) Prior Publication Data
US 2014/0374701 A1  Dec. 25, 2014

Related U.S. Application Data

(60) Provisional application No. 61/839,158, filed on Jun. 25, 2013.

(51) Int. Cl.
*H01L 31/0352* (2006.01)
*H01L 31/0304* (2006.01)
*H01L 31/101* (2006.01)

(52) U.S. Cl.
CPC .. *H01L 31/035236* (2013.01); *H01L 31/03046* (2013.01); *H01L 31/101* (2013.01)

(58) Field of Classification Search
CPC ................. H01L 31/03046; H01L 31/035236
See application file for complete search history.

(56) References Cited

U.S. PATENT DOCUMENTS

| | | |
|---|---|---|
| 4,607,272 A | 8/1986 | Osbourn |
| 5,181,086 A | 1/1993 | Yoshida |
| 5,479,032 A | 12/1995 | Forrest et al. |
| 5,536,948 A | 7/1996 | Lee |
| 5,604,356 A | 2/1997 | Shiraishi |
| 5,625,635 A | 4/1997 | Kurtz et al. |
| 5,799,026 A | 8/1998 | Meyer et al. |
| 6,229,152 B1 | 5/2001 | Dries et al. |
| 6,407,439 B1 | 6/2002 | Hier et al. |

(Continued)

FOREIGN PATENT DOCUMENTS

| | | |
|---|---|---|
| CN | 101814545 | 8/2010 |
| JP | S62291184 | 12/1987 |

(Continued)

*Primary Examiner* — Whitney T Moore
(74) *Attorney, Agent, or Firm* — Dinsmore & Shohl LLP (57) ABSTRACT

Embodiments of strain-balanced superlattice infrared detector devices and their fabrication are disclosed. In one embodiment, an infrared detector device includes a first contact layer, and absorber superlattice region, a wider gap unipolar barrier region, and a second contact layer. The absorber superlattice region has a period defined by a first InAs layer, strain-balancing structure, a second InAs layer, and an InAsSb layer. The strain-balancing structure comprises an arbitrary alloy layer sequence containing at least one constituent element of aluminum or phosphor, e.g., InGaAs, AlInAs InAsP. In another embodiment, the absorber superlattice region has a period defined by a first InAs layer, first strain-balancing structure, a second InAs layer, a first GaSb layer, a second strain-balancing structure, and a second GaSb layer. The first strain-balancing structure includes at least one constituent element of aluminum or phosphor, e.g., InGaAs, AlInAs InAsP. The second strain-balancing structure includes GaInSb and GaSb.

16 Claims, 12 Drawing Sheets

(56) References Cited

U.S. PATENT DOCUMENTS

| | | |
|---|---|---|
| 6,455,908 B1 | 9/2002 | Johnson et al. |
| 6,885,023 B2 | 4/2005 | Shields et al. |
| 6,952,018 B2 | 10/2005 | Mears et al. |
| 7,358,523 B2 | 4/2008 | Tan et al. |
| 7,687,871 B2 | 3/2010 | Maimon |
| 7,768,048 B2 | 8/2010 | Ueno et al. |
| 8,093,559 B1 | 1/2012 | Rajavel |
| 8,217,480 B2 | 7/2012 | Ting et al. |
| 8,242,538 B1 | 8/2012 | Deelman et al. |
| 8,299,497 B1 | 10/2012 | Klem et al. |
| 8,373,155 B2 | 2/2013 | Okamura et al. |
| 8,426,845 B2 | 4/2013 | Chen et al. |
| 8,450,773 B1 | 5/2013 | Kim et al. |
| 2010/0155777 A1 | 6/2010 | Hill et al. |
| 2012/0205541 A1 | 8/2012 | Lee et al. |
| 2013/0043459 A1 | 2/2013 | Chen et al. |
| 2013/0134309 A1 | 5/2013 | Rapaport |

FOREIGN PATENT DOCUMENTS

| | | |
|---|---|---|
| WO | 2004049279 | 1/2004 |
| WO | 2005050722 | 6/2005 |
| WO | 2011042682 | 4/2011 |

SUPERLATTICE STRUCTURES AND INFRARED DETECTOR DEVICES INCORPORATING THE SAME

CROSS-REFERENCE TO RELATED APPLICATIONS

This application claims the benefit of U.S. Provisional Application No. 61/839,158 filed on Jun. 25, 2013.

BACKGROUND

1. Field

The present specification generally relates to infrared detector devices and, more particularly, to infrared detector devices having a strain-balanced superlattice structure.

2. Technical Background

The nBn device structure generally includes an n-type absorber layer, a barrier layer to block majority carriers, and an n-type contact layer. For the InAs/InAsSb superlattice structure ("SLS") material, band gap tuning is achieved by tuning the Sb composition and the InAsSb layer thickness, while InAs layer is provided as a strain-balancing layer mostly to balance out the strain of the material grown on the substrate of GaSb. The InAs strain-balancing layer does not significantly contribute to optical absorption and band gap tuning. However, due to the close lattice constant between InAs and GaSb, the required InAs layer thickness to balance out the strain is significant.

On the other hand, the minority carrier hole effective mass is very large; on the order of 2 $m_e$ in the growth direction for MWIR from k·p simulations. This is because the valence band position of −0.62 eV for InAs (relative to InSb) is lower than the SLS valence band position (for MWIR, −0.4 eV to −0.5 eV) in addition to the fairly thick InAs hole barrier layer. This leads to intrinsically lower absorption and decreased carrier transport in the preferred n-type absorber material than other material systems for infrared detection, such as HgCdTe, InSb, InAs/Ga(In)Sb SLS, and the like. As the cut-off wavelength increases, the required InAs strain-balancing layer thickness increases significantly while the valence band position rises at the same time, leading to dramatically lower optical absorption with increased hole-effective mass. This makes the InAs/InAsSb SLS less practical for longer cutoff wavelengths.

SUMMARY

In one embodiment, an infrared detector device includes a first contact layer, and absorber superlattice region, a unipolar electron or hole barrier layer adjacent to the absorber superlattice region and a second contact layer adjacent to the unipolar electron or hole barrier layer. The absorber superlattice region has a period defined by a first InAs layer, a strain-balancing structure, a second InAs layer, and an InAsSb layer. The strain-balancing structure includes an arbitrary alloy sequence including at least one constituent element of aluminum and phosphorus.

In another embodiment, an infrared detector device includes a first contact layer, an absorber superlattice region, a unipolar electron or hole barrier layer adjacent to the absorber superlattice region, and a second contact layer adjacent to the unipolar electron or hole barrier layer. The absorber superlattice region has a period defined by a first InAs layer, a strain-balancing structure, a second InAs layer, and a GaSb layer. The strain-balancing structure includes a single strain-balancing layer or an arbitrary sequence of strain-balancing layers.

In yet another embodiment, an infrared detector device includes a first contact layer, an absorber superlattice region, a unipolar electron or hole barrier layer, and a second contact layer. The absorber superlattice region has a period defined by an AlInAs layer, and two or more alternating InAsSb layers of an $InAsSb_{y1}$ layer and an $InAsSb_{y2}$ layer.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

FIG. 1B is a graphic illustration of a band diagram of a period within an absorber superlattice region as depicted in FIG. 1A with a strain-balancing structure of InGaAs disposed between two InAs layers according to one or more embodiments described and illustrated herein;

DETAILED DESCRIPTION

Embodiments of the present disclosure are generally directed to infrared detector devices (e.g., barrier infrared detector devices ("BIRD")) regardless of wavelength regime, e.g., short wavelength infrared ("SWIR"), mid wavelength infrared ("MWIR"), long wavelength infrared ("LWIR"), very long wavelength infrared ("VLWIR"), etc. to increase quantum efficiency ("QE") and reduce the hole effective mass of superlattice structure ("SLS") infrared detector devices. As an example and not a limitation, the InAs/InGaAs/InAs/InAsSb superlattice structures and other superlattice structures described herein may be provided in the absorber region of the diode barrier infrared detector devices ("DBIRD") described in U.S. patent application Ser. No. 14/271,908 filed on May 7, 2014 entitled "DIODE BARRIER INFRARED DETECTOR DEVICES AND SUPERLATTICE BARRIER STRUCTURES," which is hereby incorporated by reference in its entirety.

In embodiments of the present disclosure, a strain-balancing structure having a significant lattice constant difference from the substrate material is disposed between InAs layers to provide for better strain-balancing in a material layer that has smaller lattice mismatch to the substrate material. In some embodiments, an InGaAs layer, an AlInAs layer, and/or an InAsP layer is inserted in between InAs layers as a strain-balancing structure to better balance out the strain for a baseline InAs/InAsSb SLS material forming a new SLS. Additionally, manufacturing methods for new absorber superlattice structures described herein are also disclosed. Further, embodiments of an H-bridge SWIR superlattice structures comprising two InAsSb layers with different Sb content are also disclosed. It should be understood that the infrared detector devices described herein may be provided in an array to form an imaging device, such as a focal plane array.

Various embodiments of infrared detector devices with strain-balancing structures and methods of their fabrication are described in detail below.

Figure 1A:
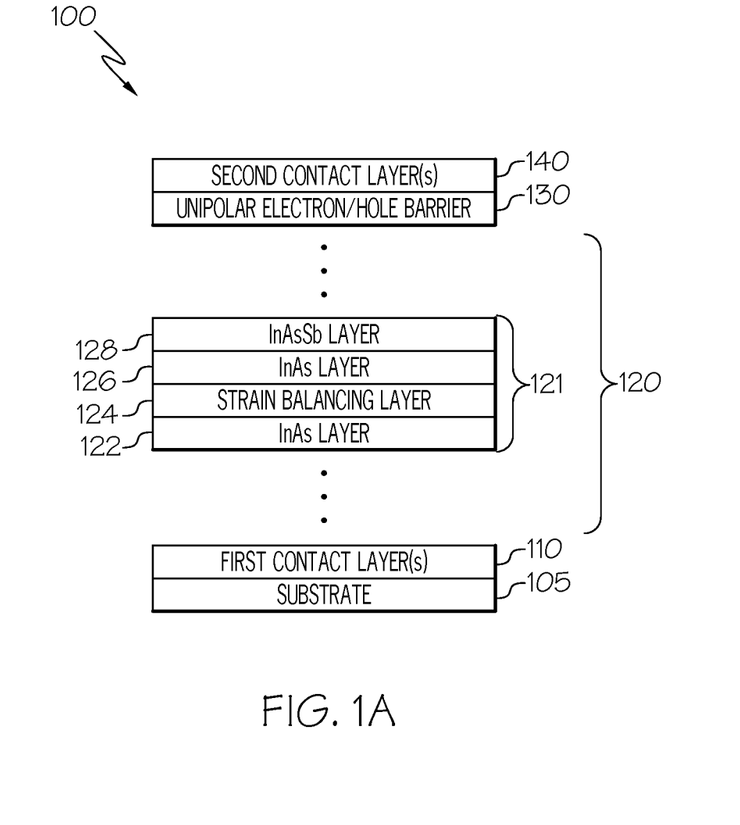
FIG. 1A is a schematic illustration of an example barrier infrared detector ("BIRD") device according to one or more embodiments described and illustrated herein.

Referring now to FIG. 1A, an example BIRD device 100 is schematically illustrated. The BIRD device 100 includes a substrate layer 105 (e.g., a GaSb substrate), a first contact layer(s) 110 (i.e., a first collector layer), an absorber superlattice region 120, a unipolar electron or hole barrier layer 130, and a second contact layer 140 (i.e., a second collector layer). In an example BIRD device 100, the first contact layer 110 is a doped n-type semiconductor material, while the second contact layer 140 is a doped p-type semiconductor material.

In the illustrated embodiment, the absorber superlattice region 120 is an n-type SLS having a period 121 defined by a first InAs layer 122, a strain-balancing structure 124, a second InAs layer 126, and an InAsSb layer 128. The period 121 of the absorber superlattice region 120 may repeat any number of times. The total number of repetitions depends on the absorption and carrier transport properties of the material to maximize device quantum efficiency. One or more strain-balancing layers defining the strain-balancing structure 124 may be ternary, quaternary, or quinary alloy strain-balancing layers. Example ternary alloy strain-balancing layers include InGaAs, AlInAs, InAsP, or combinations thereof. One or more strain-balancing layers defining a strain-balancing structure 124 are inserted between the InAs layers to balance out the strain. In this example, the inserted strain-balancing structures 124 have a smaller lattice constant than that of the substrate layer 105. The inserted strain-balancing structures 124 are under tensile stress, while the InAsSb layers 128 are under compressive stress. Overall, the average stress can cancel each other and the structure can repeat without building up stress, thereby preventing lattice defects.

FIG. 1B illustrates a band diagram of one period 121 of an absorber superlattice region 120 comprising an SLS defined by a first InAs layer 122, an InGaAs strain-balancing structure 124, a second InAs layer 126, and an InAsSb layer 128. With respect to a strain-balancing structure 124 comprising InGaAs, as the constituent GaAs material has significantly lower lattice constant than the substrate layer 105 material of GaSb, the required thickness of the InAs/InGaAs/InAs layers is much less than that of InAs alone. This reduced effective InAs layer 122, 126 thickness may lead to two simultaneous effects: (1) increased electron-hole wave function overlap per unit material thickness leading to enhanced optical absorption; and (2) reduced hole barrier layer 130 thickness leading to reduced hole effective mass. Reduced hole effective mass affects the minority carrier transport in n-type absorber superlattice region 120 material in a device structure such as nBn, allowing greater carrier diffusion length thus higher overall device quantum efficiency.

Despite that the InGaAs layer valence band is even lower than that of InAs (as shown in FIG. 1B), the improvements due to dramatic reduction of the InAs layer thickness may outweigh the effect from the InGaAs hole barrier layer 130 for properly chosen compositions.

To maximize the manufacturability, the In and As flux may be kept constant throughout the SLS growth while actuating only the ternary alloy shutter (e.g., the Ga shutter, the Al shutter, or the P shutter) and the Sb shutter on demand. For the InGaAs insertion in the InAs layers 122, 126 during fabrication, the Ga shutter may be opened while keeping the In flux and the As flux as-is. For a composition of $In_{0.5}Ga_{0.5}As$ as a non-limiting example, if the growth rate of In is tuned to about 0.5 ML/sec, a Ga growth rate of 0.5 ML/sec is needed as well. In this example, the overall growth rate would be 1.0 ML/sec. The timing may then be adjusted to the desired thickness.

To minimize the error with respect to InGaAs layer thickness (in the case where the strain-balancing structure 124 is InGaAs), shutter transient may become important for accurate control. It should be understood that the manufacturing concepts described herein with respect to InGaAs also apply to AlInAs and InAsP. Shutter transient refers to the time between a computer sending out the shutter opening command to the time the flux reaches 100% of the value when the shutter is fully open, or the time between a computer sending out the shutter closing command to the time the flux reduces to zero. This transient is further divided into two sections. The first section is a dead time between a shutter start to actuate and the flux start to ramp up or down. The second section is the time for the flux to ramp from zero to 100% or to ramp from 100% to zero. The second portion is usually nonlinear with time, but can be closely estimated based on the geometry of a cell's orifice (circular in most cases), the geometry of the shutter, the relative position of the shutter to the cell's orifice, and the actuating speed of the shutter. If a shutter closing command is sent before the flux start to ramp, there could be no material deposition. A typical shutter transient time is between 0.1 to 0.3 seconds for a research and development molecular beam epitaxy ("MBE") system, depending on the exact shutter actuation mechanism tuning and may be different from cell to cell and vary from machine to machine. For larger production MBE systems, this transient can be significantly longer. When a very thin layer is desired, this transient becomes non-negligible. Instead of experimentally tuning the timing, the shutter transients may be characterized, and the exact amount of materials deposited may be calculated and estimated for arbitrarily short shutter actuation time. The shutter transient can then be compensated properly in a growth recipe. This would reduce the cost and labor to achieve a target composition while improving the repeatability of the material growth.

On the other hand, from strain-balancing point of view alone, there is in principle no requirement on the position of the strain-balancing structure 124 relative to the InAs layer 122, 126 thickness. It may be closer to the beginning of an InAs layer or closer to the end of an InAs layer (i.e., one of the two InAs layers 122, 126 may be thicker than the other). There will be some minor effect on the cutoff wavelength by shifting the strain-balancing structure 124 position. However, it may not be desirable to position the strain-balancing structure 124 at the very beginning or the very end of the InAs layer to minimize the interface complications when the strain-balancing structure 124 is right next to the InAsSb layer 128 (potentially forming uncontrolled amount and composition of InGaAsSb due to shutter transients). Furthermore, to balance out the strain, one may choose either higher or lower Ga content for a strain-balancing structure 124 comprising InGaAs. Accordingly, there is some range of band structure tuning for any achievable cutoff wavelength.

Initial manual composition tuning of an absorber superlattice region 120 having an InAs/InGaAs/InAs/InAsSb SLS (i.e., a strain-balancing structure of InGaAs) has shown significant improvement in MWIR materials using a same InAsSb layer composition. Improvement in the LWIR can be shown with increased Sb percentage. Extension into VLWIR regime can also be shown. Example, non-limiting embodiments are illustrated and described below for MWIR, LWIR, and VLWIR bands.

Figure 2A:
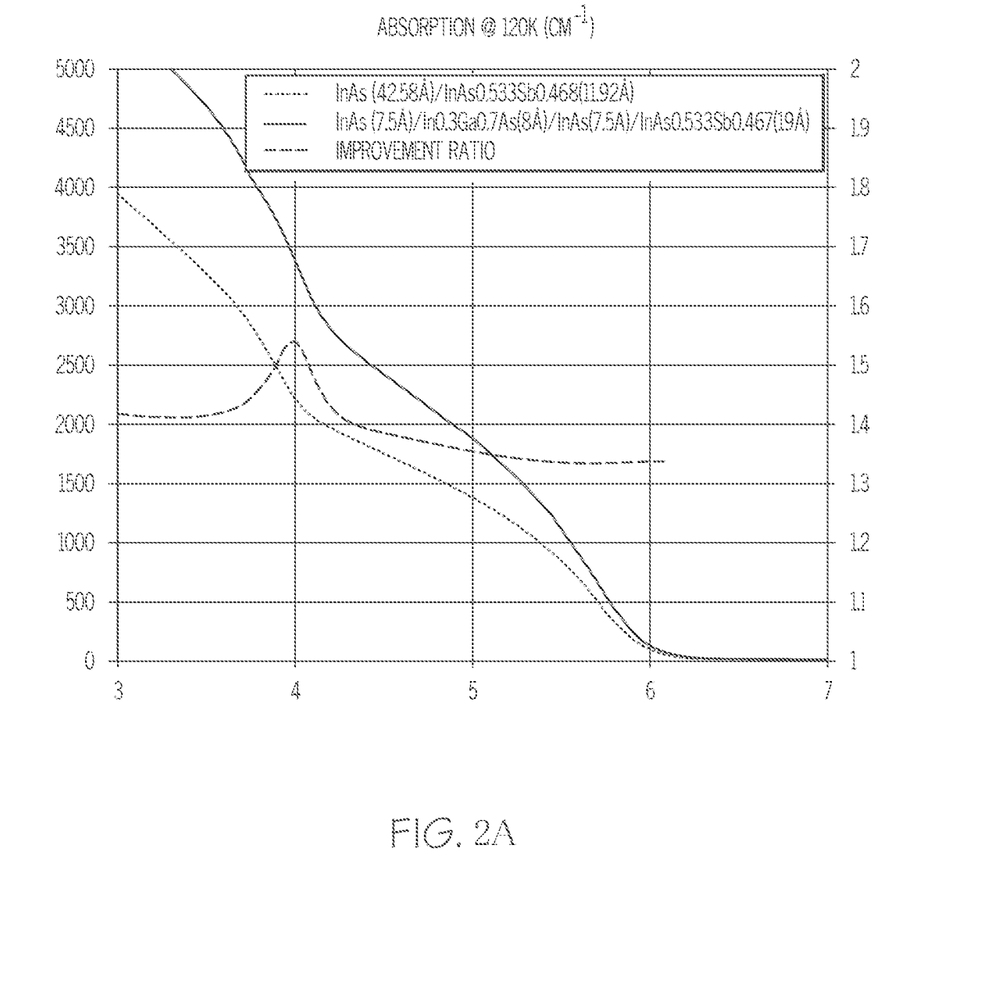
FIG. 2A is a graphic illustration of the optical absorption coefficient of an example mid-wave infrared ("MWIR") BIRD device and a comparative example according to one or more embodiments described and illustrated herein.

FIG. 2A graphically depicts the optical absorption coefficient of an exemplary MWIR embodiment configured as an SLS structure of InAs(7.5 Å)/In$_{0.3}$Ga$_{0.7}$As(8 Å)/InAs(7.5 Å)/InAs$_{0.533}$Sb$_{0.467}$(11 Å) with a period of 34 Å (Example A). FIG. 2A shows the comparison on the calculated optical absorption coefficient between Example A and a comparable InAs(42.58 Å)/InAs$_{0.533}$Sb$_{0.467}$(11.92 Å) SLS without a strain-balancing structure. As shown in FIG. 2A, at least a 30% gain is obtained in the interested wavelength range of 3.0-6.0 μm with the structure of Example A. The calculated z-direction hole effective mass of the comparable InAs/InAsSb SLS is 2.09 m$_e$, while that for the InAs/InGaAs/InAs/InAsSb SLS of example A is 1.90 m$_e$, which is almost the same.

Figure 2B:
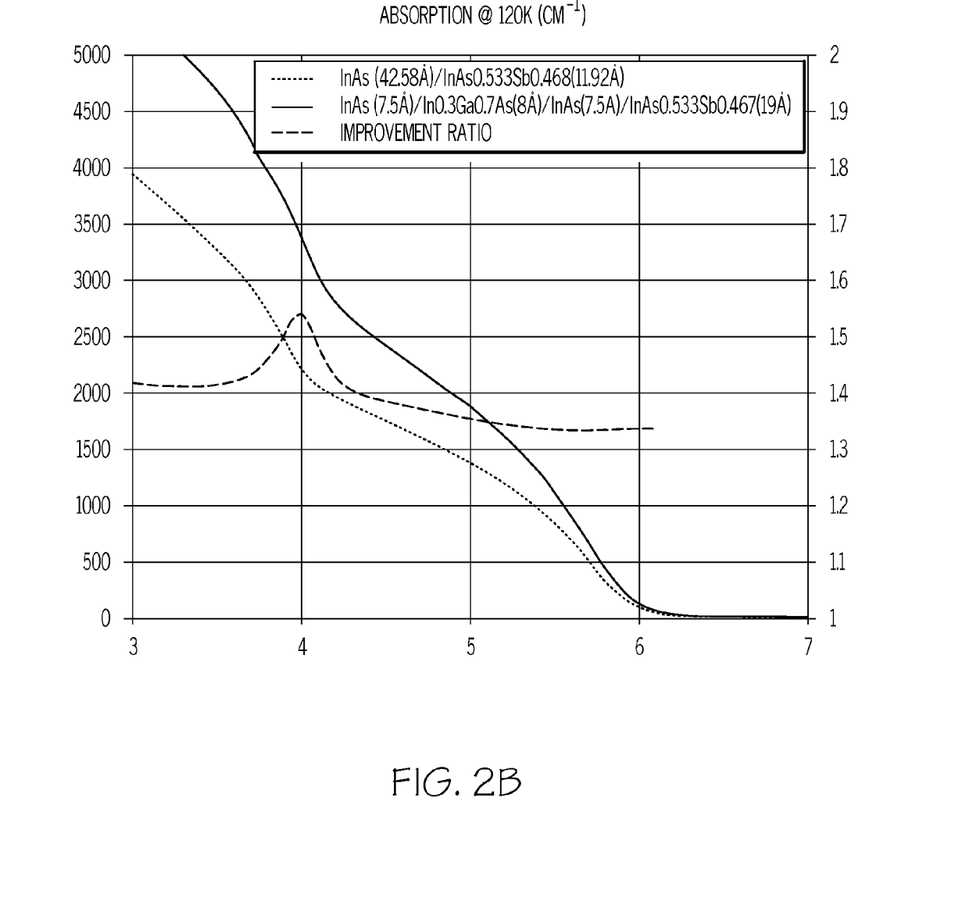
FIG. 2B is a graphic illustration of the optical absorption coefficient of an example MWIR BIRD device to according one or more embodiments described and illustrated herein and a comparative example.

FIG. 2B graphically depicts the optical absorption coefficient of an exemplary MWIR embodiment configured as an SLS structure of InAs(10 Å)/In$_{0.5}$Ga$_{0.5}$As(5 Å)/InAs(10 Å)/InAs$_{0.51}$Sb$_{0.49}$(11 Å) with a period of 36 Å (Example B). FIG. 2B shows the comparison on the calculated optical absorption coefficient between Example B and a comparable InAs(45 Å)/InAs$_{0.51}$Sb$_{0.49}$(9.86 Å) SLS. As shown in FIG. 2B, at least a 40% gain is obtained in the interested wavelength range of 3.0-5.5 μm with the structure of Example B. The calculated z-direction hole effective mass of the InAs/InAsSb SLS is 1.54 m$_e$, while that for the InAs/InGaAs/InAs/InAsSb SLS of Example B is 0.706 m$_e$, a factor of 2.2 improvement.

Figure 2C:
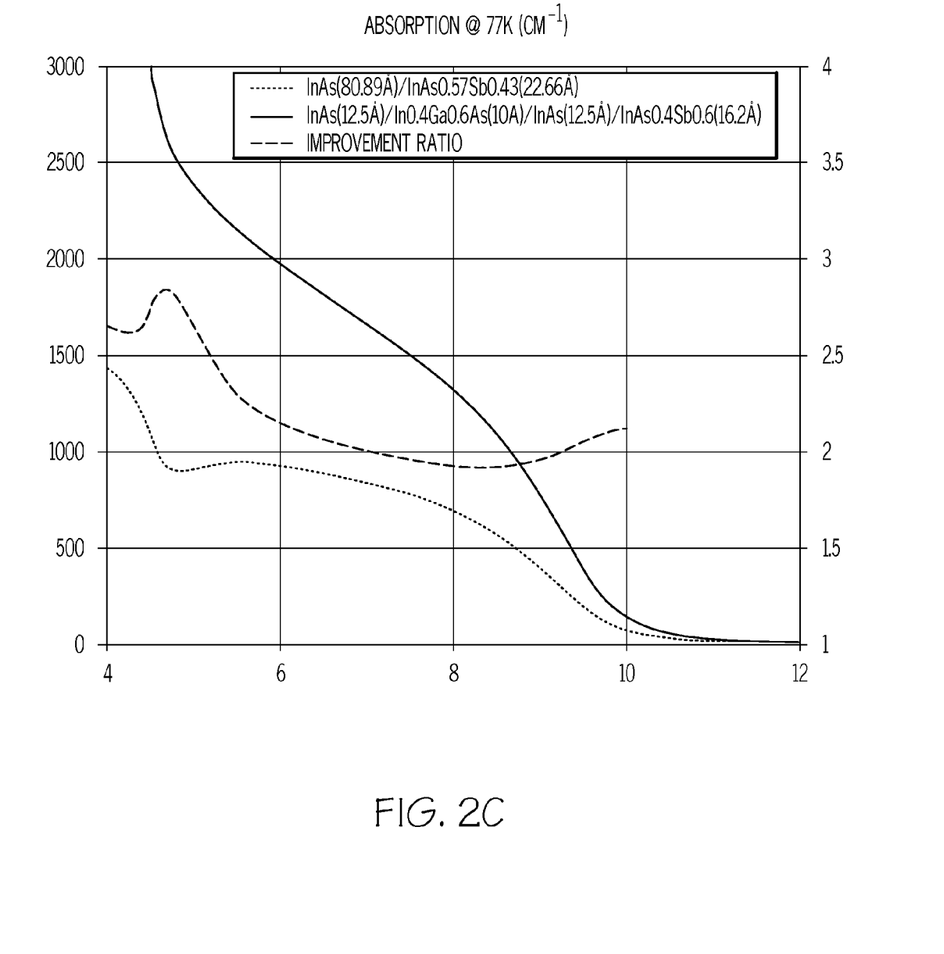
FIG. 2C is a graphic illustration of the optical absorption coefficient of an example long-wave infrared ("LWIR") BIRD device according to one or more embodiments described and illustrated herein and a comparative example.

FIG. 2C graphically depicts the optical absorption coefficient of an exemplary LWIR embodiment configured as an SLS structure of InAs(12.5 Å)/In$_{0.4}$Ga$_{0.6}$As(10 Å)/InAs(12.5 Å)/InAs$_{0.4}$Sb$_{0.6}$(16.2 Å) with a period of 51.2 Å (Example C). FIG. 2C shows the comparison on the calculated optical absorption coefficient between Example C and an InAs(80.89 Å)/InAs$_{0.57}$Sb$_{0.43}$(22.66 Å) SLS. As shown in FIG. 2C, at least a 90% gain is obtained in the interested wavelength range of 8.0-10.0 μm with the structure of Example C. The calculated z-direction hole effective mass of state-of-the-art InAs/InAsSb SLS is 41.7 m$_e$, while that for the InAs/InGaAs/InAs/InAsSb SLS of Example C is 11.6 m$_e$, which is much lower.

Figure 2D:
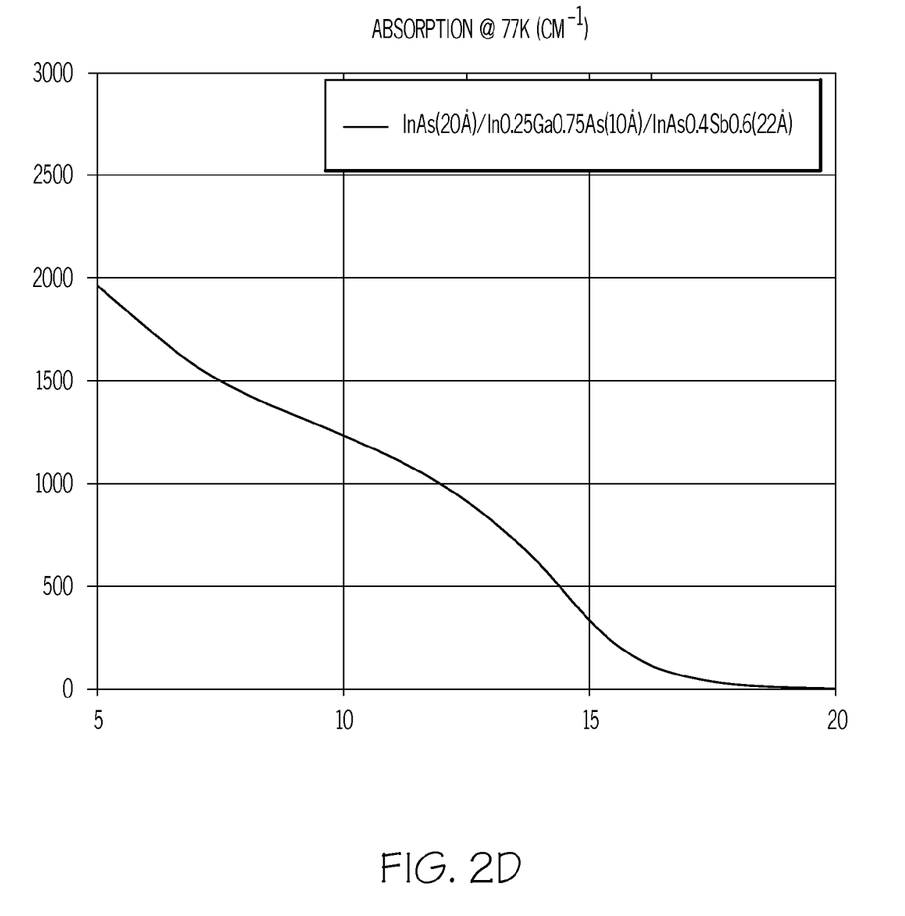
FIG. 2D is a graphic illustration of the optical absorption coefficient of an exemplary very long-wave infrared ("VLWIR") BIRD device according to one or more embodiments described and illustrated herein.

FIG. 2D graphically depicts the optical absorption coefficient of an exemplary VLWIR embodiment configured as an SLS structure of InAs(20 Å)/In$_{0.25}$Ga$_{0.75}$As(10 Å)/InAs(20 Å)/InAs$_{0.4}$Sb$_{0.6}$(22 Å) with a period of 72 Å (Example D). FIG. 2D shows the calculated optical absorption coefficient. The calculated effective mass is 63.1 m$_e$. This thickness is significantly less than a VLWIR SLS design without the InGaAs insertion. Due to the type II band alignment, optical absorption happens mostly around the interfaces. A reduced period leads to increased interface density per unit material thickness. This in turn leads to greatly improved optical absorption.

Figure 3:
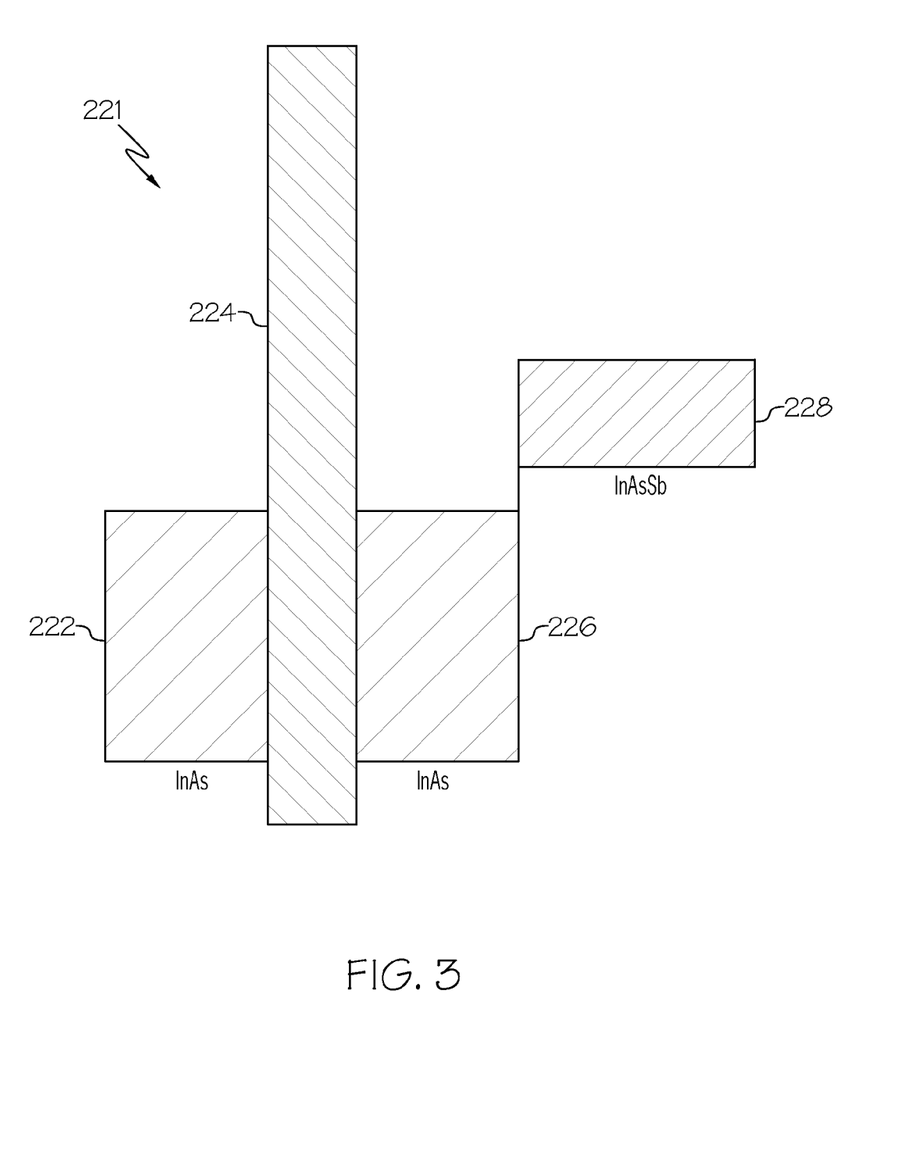
FIG. 3 is a schematic illustration of a period of an absorber superlattice region having an AlInAs or InAsP strain-balancing structure according to one or more embodiments described and illustrated herein.

As stated above, AlInAs or InAsP may be inserted between the first InAs layer 122 and the second InAs layer 126 as a strain-balancing structure 124 to balance out the strain as well. FIG. 3 depicts a period 221 of an absorber superlattice region defining an absorber SLS comprising a first InAs layer 222, an AlInAs or InAsP strain-balancing structure 224, a second InAs layer 226, and an InAsSb layer 228.

Due to the minority carrier mobility issues in the natively n-type InAs/InAsSb SLS, it may be desirable to utilize a p-type InAs/InAsSb SLS as the material for the absorber superlattice region. As for p-type absorber material, the minority carriers are electrons that have orders of magnitude higher mobility than the holes for an n-type material. Even with much shorter carrier lifetime, the diffusion length could still be significantly longer, as the square of diffusion length is proportional to the product of mobility and carrier lifetime. As such, carrier transport is not an issue. For at least this reason, a pBp barrier structure may be appealing. However, the device sidewall surface of p-type InAs/InAsSb SLS material would natively invert to n-type over time. This may create a low impedance shunt conduction path along the surface and short the device structure.

In embodiments wherein AlInAs is used as the material for the strain-balancing structure (e.g., strain-balancing structure 224 shown in FIG. 3), due to natural oxidization of Al in an oxygen-containing atmosphere, the SLS could be self-passivating on a mesa sidewall, as aluminum oxide is an insulator that would block the surface leakage. This may make a pBp device structure more practical utilizing a p-type absorber SLS and a wider gap SLS for the unipolar Barrier layer (i.e., the "B" in "pBp" acronym). For a p-type absorber made of InAs/InAsSb SLS, a known issue is the surface inversion to n-type and the difficulty to passivate the inverted surface. Using Al containing SLS as a p-type absorber and/or barrier, there is the potential of blocking the surface leakage path which may cause an electrical short along the sidewalls of the infrared detector device, thus resolving the passivation issue.

Figure 4:
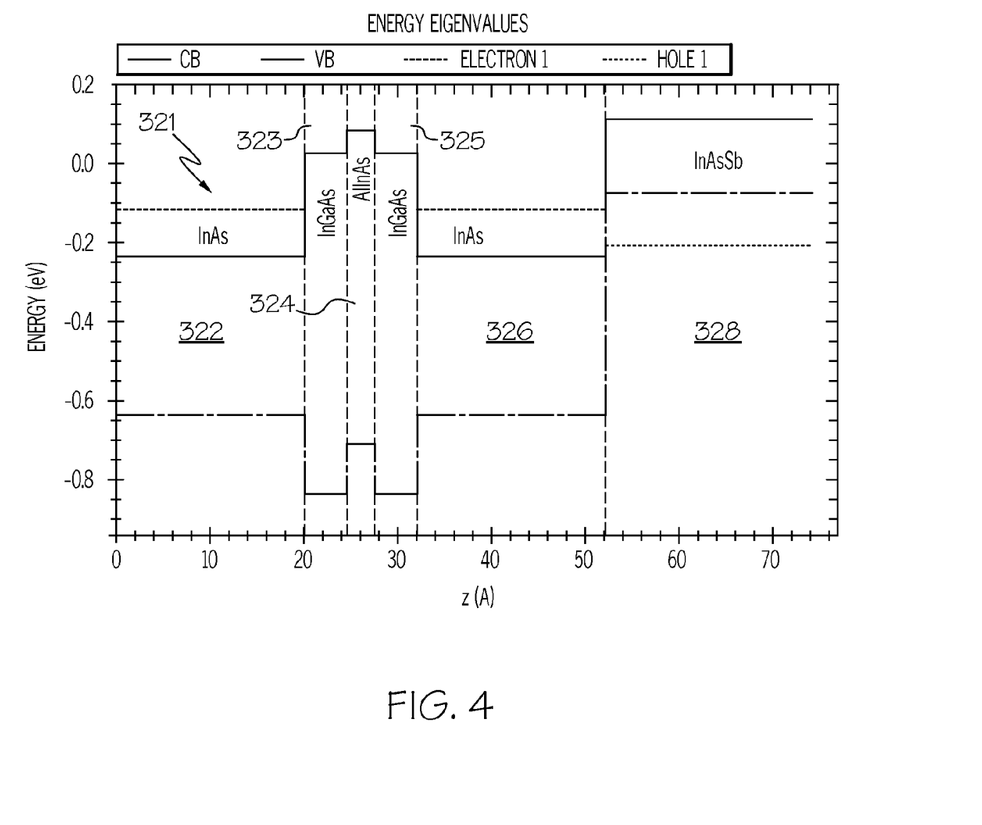
FIG. 4 is a graphic illustration of a band diagram of a period within an absorber superlattice region having InGaAs and AlInAs layers disposed between InAs layers according to one or more embodiments described and illustrated herein.

In some embodiments, more than one strain-balancing layer of more than one material type may be utilized to define the strain-balancing structure. For example, multiple strain-balancing layers may be used in a LWIR device. FIG. 4 illustrates a non-limiting SLS period 321 for an absorber superlattice region of a VLWIR device with both InGaAs and AlInAs insertions that define a strain-balancing structure. More specifically, the period is defined by a first InAs layer 322, a first InGaAs layer 323, an AlInAs layer 324, a second InGaAs layer 325, a second InAs layer 326, and an InAsSb layer. The SLS illustrated in FIG. 4 has a cutoff wavelength of around 13.3 µm @ 60K. The insertion of AlInAs layers offers two potential benefits: (i) self surface passivation due to Al oxidization, and (ii) one more tuning parameter for SLS design flexibility.

In yet other embodiments, the absorber superlattice region may comprise GaSb rather than InAsSb as describe above. For example, the absorber superlattice may comprise InAs/GaSb. To enable this material for covering the MWIR regime or shorter cutoff wavelength, the interfaces need to be either <1 ML of InSb or to contain GaInAsSb quaternaries to maintain strain-balancing. For <1 ML of InSb at the interfaces, the interface material other than the InSb is uncontrolled. Dynamic material growth could lead to material defects. For the quaternary interfaces, precise timing may be required to control the interface composition, which affects manufacturability.

In some embodiments, one or more strain-balancing layers defining a strain-balancing structure may be included in between adjacent InAs layers of a InAs/GaSb SLS. For an InAs/GaSb SLS, InGaAs, AlInAs, and InAsP may be inserted between InAs layers as strain-balancing layers to balance out the strain induced by 1 ML of the InSb interface. For a cutoff wavelength in the MWIR or shorter range, it requires thin enough InAs layers such that 1 ML of InSb will lead to a net compressive strain. This is not desirable as it will lead to smaller critical thickness, which may be detrimental for a photodetector structure with high quantum efficiency. Adding GaAs, AlAs, or InP content within the InAs layers according to the embodiments described herein may balance the residue strain induced by the 1 ML of InSb interfaces.

Figure 5:
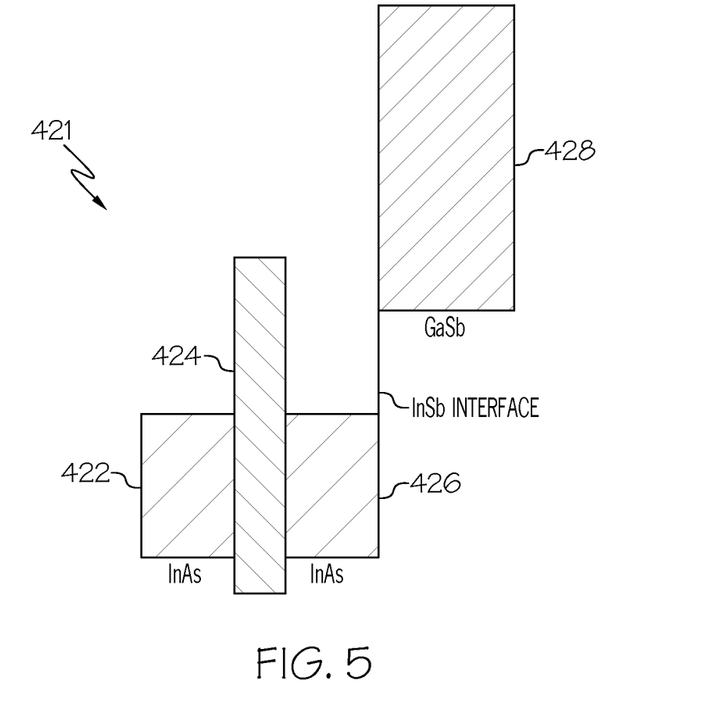
FIG. 5 is a schematic illustration of a period of an absorber superlattice region having a GaSb layer and a strain-balancing structure disposed between InAs layers according to one or more embodiments described and illustrated herein.

FIG. 5 illustrates an example period 421 for an example absorber superlattice region comprising a first InAs layer 422, a strain-balancing structure 424 (e.g., comprising one or more layers of InGaAs, InAsP, AlInAs, or any alloy formed using two or more ternary components), a second InAs layer 426, and a GaSb layer 428. As InGaAs, AlInAs, and InAsP all contain InAs content, the insertion of the strain-balancing layers may occur without actuating either the indium shutter or the arsenic shutter. This makes the insertion of the strain-balancing layers easily manufacturable. Insertion of Al containing ternaries could also make the SLS material of the absorber superlattice region self-passivated due to the oxidization of the Al content in an oxygen containing environment (e.g., air).

In another scenario, InAs/GaInSb ternary SLS materials may be utilized. The advantage of a ternary GaInSb compared with a binary GaSb is that the extra strain leads to higher optical absorption. However, to grow the SLS, two indium cells are needed, which is not always available depending on reactor configurations. Being able to take the advantage of the strained ternary SLS without the necessity of two indium cells would be advantageous as the reactor would have one more port for another cell, greatly increasing the versatility of a reactor.

Figure 6:
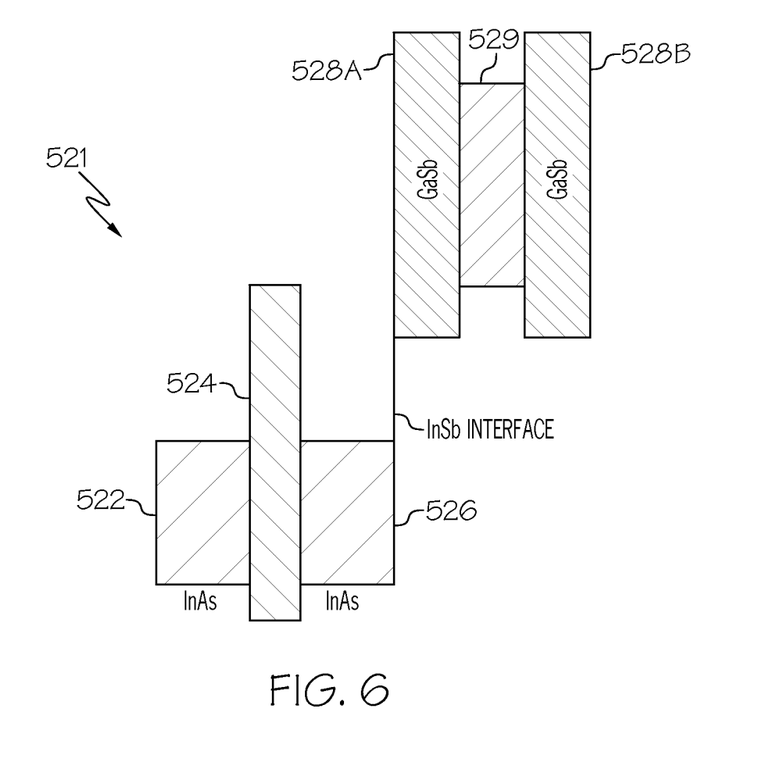
FIG. 6 is a schematic illustration of a period of an absorber superlattice region having a GaInSb layer disposed between GaSb layers, and a strain-balancing structure disposed between InAs layers according to one or more embodiments described and illustrated herein.

In embodiments utilizing GaSb, a second strain-balancing structure (e.g., a GaInSb layer) can be inserted within the GaSb layers to increase the internal strain. Increased internal strain will lead to increased optical absorption and provide for a better tuning range. FIG. 6 illustrates an example period 521 for an example absorber superlattice region comprising a first InAs layer 522, a strain-balancing structure 524 (e.g., comprising one or more layers of InGaAs, InAsP, AlInAs, or any alloy formed using two or more ternary components), and a second InAs layer 526. The example period 521 further includes a first GaSb layer 528A, a second strain-balancing structure 529 (e.g. comprising one or more layers of GaInSb and GaSb sequence, and a second GaSb layer 528B).

The insertion of the GaInSb layer 529 between the GaSb layers 528A, 528B may be realized by opening the indium shutter in the middle of GaSb layer growth while keeping the Ga and Sb shutters open. The indium flux can be the same as that used for InAs (though not necessarily have to). This makes the insertion of GaInSb manufacturable. Compared with full thickness of GaInSb layers, the GaSb/GaInSb/GaSb combination would be more controllable, as only the interface between InAs and GaSb (four shutters) need to be managed instead of that the interface between InAs and GaInSb (five shutters using two indium cells). At usual growth temperatures of these III-V materials (including phosphide, arsenide, and antimonide), group III atoms would stick 100% onto the substrate surface (i.e., the sticking coefficient of unity). Assuming that the flux rate of Ga is A, and that for In is B, the composition "x" of $Ga_xIn_{1-x}Sb$ would be $A/(A+B)$.

From simulations, the practical cutoff wavelength limit for an absorber superlattice region comprising an InAs/InAsSb SLS is around 4.0 µm at the shorter end. This limits the application of InAs/InAsSb SLS for SWIR applications. By implementing AlInAs barriers and two InAsSb layers with different Sb %, the cutoff wavelength can be effectively pushed towards a SWIR regime.

Figure 7A:
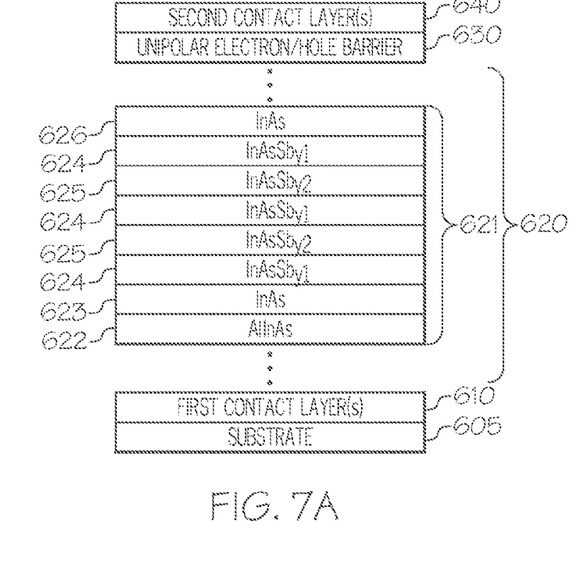
FIG. 7A is a schematic illustration of an example BIRD device having an absorber superlattice region defined by an H-Bridge SLS according to one or more embodiments described and illustrated herein.

FIG. 7A illustrates an example BIRD device structure 600 of a infrared detector device comprising a substrate layer 605, a first contact layer(s) 610, an absorber superlattice region 620, a unipolar electron barrier layer 630, and a second contact layer(s) 640. To shift the cutoff wavelength to a SWIR wavelength, the example absorber superlattice region 620 of the illustrated embodiment is defined by an H-Bridge SLS having a period 621 comprising an AlInAs layer 622, a first InAs layer 623, two or more alternating InAsSb layers of an $InAsSb_{y1}$ layer 624 and an $InAsSb_{y2}$ layer 625 where $y_1$ is different than $y_2$, and a second InAs layer 626. In one embodiment, $y_2 > y_1$.

Figure 7B:
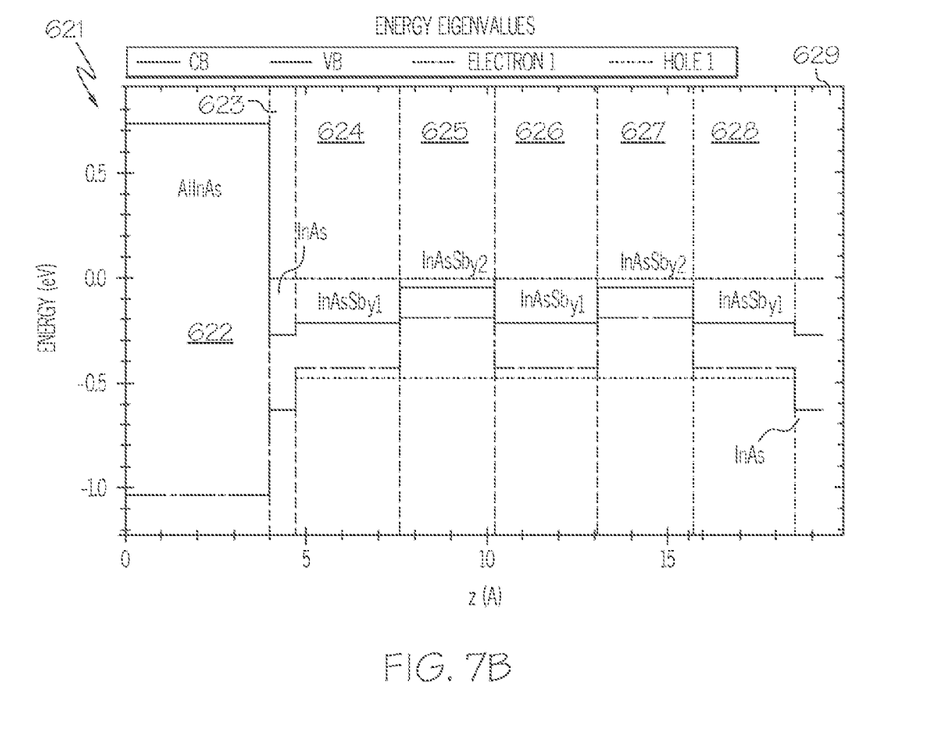
FIG. 7B is a graphic illustration of a band diagram of a period of the H-Bridge SLS depicted in FIG. 7A according to one or more embodiments described and illustrated herein.

FIG. 7B graphically illustrates the band line-up for the example H-Bridge SWIR SLS period 621 depicted in FIG. 7A with a cutoff wavelength tunable around 2.6 µm. Due to the type II band alignment between the $InAsSb_{y1}$ layers 624 and the $InAsSb_{y2}$ layers 625, optical absorption happens mostly near the interfaces. Multiple alternations of $InAsSb_{y1}$/$InAsSb_{y2}$ layers 624, 625 are implemented to enhance the optical absorption near the band edge.

Figure 7C:
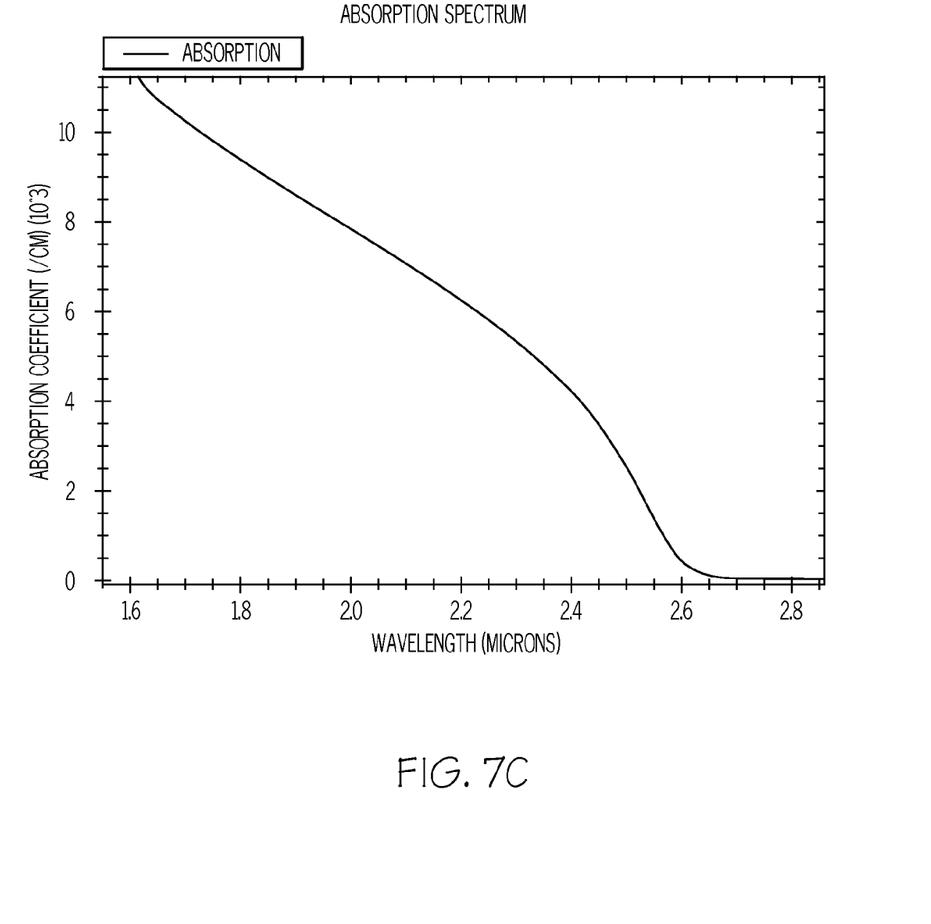
FIG. 7C is a graphic illustration of the optical absorption for the example H-Bridge SWIR SLS depicted in FIGS. 7A and 7B according to one or more embodiments described and illustrated herein.

The calculated optical absorption for the example H-Bridge SWIR SLS period 621 depicted in FIGS. 7A and 7B is graphically illustrated in FIG. 7C. The absorption coefficient at 4.0 µm is above 4000 $cm^{-1}$. The cutoff wavelength is around 2.6 µm at 220K. Additionally, the calculated vertical band offset ("VBO") of this SLS is around −0.48 eV (relative to that of InSb). This matches with the VBO for AlAsSb lattice matched to GaSb, which may be desirable for an nBn type device to reduce the dark current density that is advantageous for SWIR low background applications. Due to the thinness of the AlInAs layers, the calculated hole effective mass along the growth direction is around 0.2 $m_e$. The hole mobility would presumably be high enough not to incur any carrier transport issue for n-type absorber materials, as the mobility is inversely proportional to the effective mass.

For the SLS depicted in FIGS. 7A and 7B, the "InAs" species exist across the entire absorber superlattice region 620. Therefore, the In shutter and the As shutter may be kept open throughout the material growth. The only shutters that need actuation are Al shutter and $Sb_{y1}/Sb_{y2}$ shutters, which makes the structure highly manufacturable.

As the material is lattice matched to GaSb substrate, the SWIR SLS depicted in FIGS. 7A and 7B may be used in combination with existing MWIR and LWIR SLS materials to either improve the device performance, or to create multi-band device structures for applications such as SW/MW, SW/MW/LW, and the like. Additionally, as the material contains AlInAs layers, the SLS may be self-passivated in an oxygen containing environment (e.g., the air).

The foregoing description of the various embodiments described herein has been presented for the purposes of illustration and description. It is not intended to be exhaustive or to limit the embodiments disclosed herein to the precise steps and/or forms disclosed. Many alternatives, modifications and variations will be apparent to those skilled in the art of the above teaching. Moreover, although multiple inventive aspects have been presented, such aspects need not be utilized in combination, and various combinations of inventive aspects are possible in light of the various embodiments provided above. Accordingly, the above description is intended to embrace all possible alternatives, modifications, combinations, and variations that have been discussed or suggested herein, as well as all others that fall with the principles, spirit and broad scope of the disclosed embodiments as defined by the claims.

What is claimed is:

1. An infrared detector device comprising:
   a first contact layer;
   an absorber superlattice region having a period defined by a first InAs layer, a strain-balancing structure, a second InAs layer, and an InAsSb layer, wherein the strain-balancing structure comprises an alloy sequence comprising at least one constituent element of aluminum and phosphorus;
   a unipolar electron or hole barrier layer adjacent to the absorber superlattice region; and
   a second contact layer adjacent to the unipolar electron or hole barrier layer.

2. The infrared detector device as claimed in claim 1, wherein the strain-balancing structure comprises a first InGaAs layer, an AlInAs layer, and a second InGaAs layer.

3. The infrared detector device as claimed in claim 1, wherein:
   the absorber superlattice region is doped p-type; and
   one or more layers of the absorber superlattice region comprise aluminum, wherein the aluminum provides for self passivation that prevents formation of an electrical short on sidewalls of the infrared detector device.

4. The infrared detector device as claimed in claim 1, wherein:
   the absorber superlattice region is doped p-type; and
   the unipolar electron or hole barrier layer is a unipolar hole barrier layer that comprises aluminum, wherein the aluminum provides for self passivation that prevents formation of an electrical short on sidewalls of the infrared detector device.

5. The infrared detector device as claimed in claim 4, wherein one or more layers of the absorber superlattice region comprises aluminum.

6. An infrared detector device comprising: a first contact layer; an absorber superlattice region, the absorber superlattice region having a period defined by a first InAs layer, a strain-balancing structure, a second InAs layer, and a GaSb layer, wherein the strain-balancing structure comprises a single strain-balancing layer or a sequence of strain-balancing layers; a unipolar electron or hole barrier layer adjacent to the absorber superlattice region, and a second contact layer adjacent to the unipolar electron or hole barrier layer.

7. The infrared detector device as claimed in claim 6, wherein the GaSb layer comprises a first GaSb layer, a second GaSb layer, and a second strain balancing structure disposed between the first GaSb layer and the second GaSb layer.

8. The infrared detector device as claimed in claim 6, wherein the second strain balancing structure comprises an sequence of GaInSb and GaSb layers.

9. The infrared detector device as claimed in claim 6, wherein the strain-balancing structure comprises an alloy sequence comprising at least one of a constituent element of aluminum and phosphorus.

10. The infrared detector device as claimed in claim 9, wherein the alloy sequence comprises at least one of InGaAs, AlInAs, and InAsP.

11. The infrared detector device as claimed in claim 6, wherein:
   the absorber superlattice region is doped p-type; and
   one or more layers of the absorber superlattice region comprise aluminum, wherein the aluminum provides for self passivation that prevents formation of an electrical short on sidewalls of the infrared detector device.

12. The infrared detector device as claimed in claim 6, wherein:
   the absorber superlattice region is doped p-type; and
   the unipolar electron or hole barrier layer is a unipolar hole barrier layer that comprises aluminum, wherein the aluminum provides for self passivation that prevents formation of an electrical short on sidewalls of the infrared detector device.

13. The infrared detector device as claimed in claim 12, wherein one or more layers of the absorber superlattice region comprises aluminum.

14. An infrared detector device comprising:
   a first contact layer;
   an absorber superlattice region having a period defined by:
      an AlInAs layer; and
      two or more alternating InAsSb layers of an $InAsSb_{y1}$ layer and an $InAsSb_{y2}$ layer;
   a unipolar electron or hole barrier layer adjacent to the absorber superlattice region, and
   a second contact layer adjacent to the unipolar electron or hole barrier layer.

15. The infrared detector device as claimed in claim 14, wherein $y_1$ is different from $y_2$.

16. The infrared detector device of claim 14, wherein the period of the absorber superlattice region is further defined by a first InAs layer adjacent to the AlInAs layer and a second InAs layer adjacent to the two or more alternating InAsSb layers.

* * * * *